United States Patent
Hiramatsu et al.

(10) Patent No.: US 7,637,413 B2
(45) Date of Patent: Dec. 29, 2009

(54) X-RAY INSPECTION DEVICE AND X-RAY INSPECTION METHOD

(75) Inventors: Tomoyuki Hiramatsu, Chiryu (JP); Yoshinori Hayashi, Okazaki (JP); Hisashi Hasegawa, Okazaki (JP)

(73) Assignee: DENSO CORPORATION, Kariya (JP)

( * ) Notice: Subject to any disclaimer, the term of this patent is extended or adjusted under 35 U.S.C. 154(b) by 495 days.

(21) Appl. No.: 11/357,045

(22) Filed: Feb. 21, 2006

(65) Prior Publication Data

US 2006/0196914 A1 Sep. 7, 2006

(30) Foreign Application Priority Data

Mar. 1, 2005 (JP) ............................. 2005-056640
Dec. 2, 2005 (JP) ............................. 2005-349606

(51) Int. Cl.
*B23K 31/12* (2006.01)
(52) U.S. Cl. ............................ 228/103; 228/8; 382/150
(58) Field of Classification Search ................ 228/8, 228/105, 103; 382/150
See application file for complete search history.

(56) References Cited

U.S. PATENT DOCUMENTS

| 4,852,131 | A | 7/1989 | Armistead |
| 5,719,952 | A | 2/1998 | Rooks |
| 6,657,135 | B2 * | 12/2003 | Suetsugu et al. ............ 174/262 |
| 6,823,040 | B1 | 11/2004 | Teraoka |
| 2003/0173666 | A1 * | 9/2003 | Taniguchi et al. ........... 257/738 |

FOREIGN PATENT DOCUMENTS

| JP | A-2003-240736 | 8/2003 |
| JP | A-2004-212200 | 7/2004 |
| WO | WO 99/64882 | 12/1999 |
| WO | WO 01/35051 A2 | 5/2001 |

OTHER PUBLICATIONS

Search Report dated Dec. 21, 2007 in corresponding Spanish application No. 200600457.
Office Action dated Oct. 8, 2008 in corresponding Spanish patent application No. 200600457 (and English translation).
Office Action dated Dec. 19, 2008 in corresponding Chinese patent application No. 200610019831.9 (and English translation).
Office Action dated May 8, 2009 in corresponding Spanish patent application No. 200600457 (and English translation).

* cited by examiner

*Primary Examiner*—Jessica L. Ward
*Assistant Examiner*—Nicholas P D'Aniello
(74) *Attorney, Agent, or Firm*—Posz Law Group, PLC (57) ABSTRACT

A X-ray inspection device for inspecting a solder connection portion between a circuit device having a solder ball and a printed circuit board having a land includes: X-ray irradiating means for irradiating X-ray to the solder connection portion between the solder ball and the land; X-ray detecting means for detecting the X-ray transmitted through the solder connection portion and for outputting a detection signal; and image forming means for forming and outputting a horizontal tomographic image of the solder connection portion on the basis of the detection signal. The horizontal tomographic image shows existence or nonexistence of a solder bump disposed on a side of the land.

14 Claims, 6 Drawing Sheets

X-RAY INSPECTION DEVICE AND X-RAY INSPECTION METHOD

CROSS REFERENCE TO RELATED APPLICATIONS

This application is based on Japanese Patent Applications No. 2005-56640 filed on Mar. 1, 2005, and No. 2005-349606 filed on Dec. 2, 2005, the disclosures of which are incorporated herein by reference.

FIELD OF THE INVENTION

The present invention relates to a X-ray inspection device and a X-ray inspection method.

BACKGROUND OF THE INVENTION

Conventionally, a X-ray inspection method for inspecting a connection state of a solder connection portion between a circuit device and a printed circuit board is disclosed in U.S. Pat. No. 6,823,040. A solder ball is formed in a lattice pattern on one side of the circuit device, and a land is formed on a position of the printed circuit board corresponding to the solder ball.

The X-ray inspection method disclosed in U.S. Pat. No. 6,823,040 includes a step of mounting a sample on a table, the sample in which the circuit device is mounted on the printed circuit board. Then, a X-ray source is arranged to face a X-ray detection portion with sandwiching the table therebetween. Then, the X-ray source and the X-ray detection portion are rotated while the X-ray source irradiates a X-ray toward the sample. Thus, a tomographic image along with a direction perpendicular to a principal surface of the printed circuit board is obtained. On the basis of the tomographic image, failure of the solder ball peeled off is detected.

In general, failure of the connection state of the solder connection portion between the solder ball and the land is a floating state in such a manner that the solder ball is completely separated from the land. Further, the failure includes a state that the solder ball is not completely melted so that the solder ball is partially bonded to the land. When the solder ball is partially bonded to the land, there is a possibility to break the solder connection portion with short time by temperature cycle load or vibration.

However, the shape of the solder connection portion in a state where the solder ball is partially bonded to the land has no critical difference from the shape of the solder connection portion between the solder ball and the land in a state where the solder ball is normally bonded to the land. In the inspection method disclosed in U.S. Pat. No. 6,823,040, the floating failure of the solder ball can be detected by using the tomographic image perpendicular to the principal surface of the printed circuit board. However, it is difficult to detect the failure that the solder ball is partially bonded to the land.

Further, the inspection method defines that the tomographic image in parallel to the principal surface of the printed circuit board can be obtained in addition to the tomographic image perpendicular to the principal surface of the printed circuit board. However, the inspection method does not define the failure that the solder ball is partially bonded to the land.

SUMMARY OF THE INVENTION

In view of the above-described problem, it is an object of the present invention to provide a X-ray inspection device. It is another object of the present invention to provide a X-ray inspection method.

A X-ray inspection device for inspecting a solder connection portion between a circuit device having a solder ball and a printed circuit board having a land, the device includes: X-ray irradiating means for irradiating X-ray to the solder connection portion when the solder ball of the circuit device is bonded to the land of the printed circuit board for forming the solder connection portion between the solder ball and the land; X-ray detecting means for detecting the X-ray transmitted through the solder connection portion and for outputting a detection signal corresponding to the detected X-ray; and image forming means for forming and outputting a horizontal tomographic image of the solder connection portion on the basis of the detection signal. The horizontal tomographic image shows existence or nonexistence of a solder bump disposed on a side of the land.

When the circuit device having a solder ball is mounted on the printed circuit board including a land disposed separately from the resist, the solder ball is melted so that the solder ball is normally bonded to the land. In this state, the solder bump is formed on the top and on the side of the land. However, when the solder ball and the land are not completely bonded together so that the solder ball is separated from the land or the solder ball is partially bonded to the land, the solder bump is hardly formed on the side of the land. Accordingly, the X-ray is irradiated to the solder connection portion in a state where the circuit device is mounted on the printed circuit board, and the horizontal tomographic image showing existence or nonexistence of the solder bump is formed and outputted on the basis of the X-ray transmitted through the solder connection portion. Thus, not only the floating failure of the solder ball but also the failure that the solder ball is partially bonded to the land can be inspected. Therefore, the failure of the solder connection portion is reliably inspected.

Further, a X-ray inspection method for inspecting a solder connection portion between a circuit device and a printed circuit board by using a X-ray inspection device is provided. The circuit device includes a solder ball disposed on a surface of the circuit device facing the printed circuit board, and the printed circuit board includes a land disposed on a position of a surface of the printed circuit board corresponding to the solder ball. The method includes the steps of: irradiating a X-ray to the solder connection portion by using the X-ray inspection device when the solder ball of the circuit device is bonded to the land of the printed circuit board for forming the solder connection portion between the solder ball and the land; detecting the X-ray transmitted through the solder connection portion; outputting a detection signal corresponding to the detected X-ray; and forming and outputting a horizontal tomographic image of the solder connection portion on the basis of the detection signal. The horizontal tomographic image shows existence or nonexistence of a solder bump disposed on a side of the land.

Thus, when the circuit device having a solder ball is mounted on the printed circuit board having a land separated from the resist, the solder ball and the land are normally bonded. In this state, the solder bump is formed on the top and the side of the land. However, when the solder ball and the land are not completely bonded together so that the solder ball is separated from the land, or the solder ball is partially bonded to the land, the solder bump is not substantially formed on the side of the land. Accordingly, the horizontal tomographic image showing existence or nonexistence of the solder bump is formed and outputted, the solder bump which is disposed on the side of the land separated from the resist. Thus, not only the floating failure of the solder ball but also the failure that the solder ball is partially bonded to the land can be inspected. Therefore, the failure of the solder connection portion is reliably inspected.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
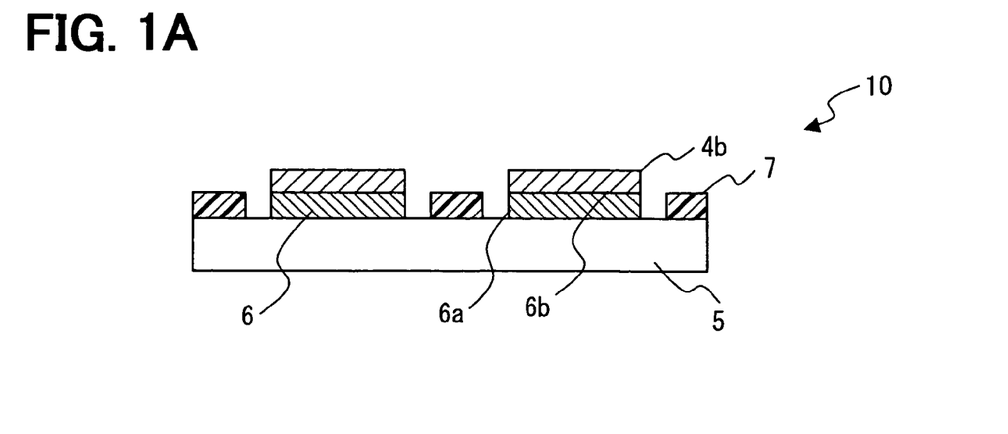
FIG. 1A is a partial cross sectional view showing a printed circuit board according to a first embodiment of the present invention.
Figure 1B:
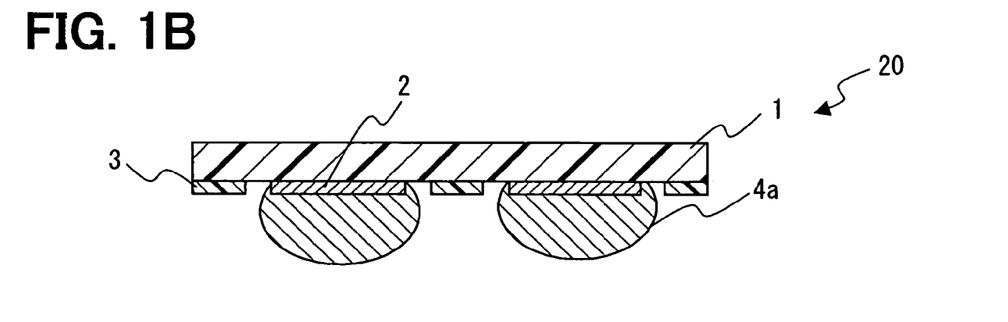
FIG. 1B is a partial cross sectional view showing a circuit device according to the first embodiment.
Figure 2:
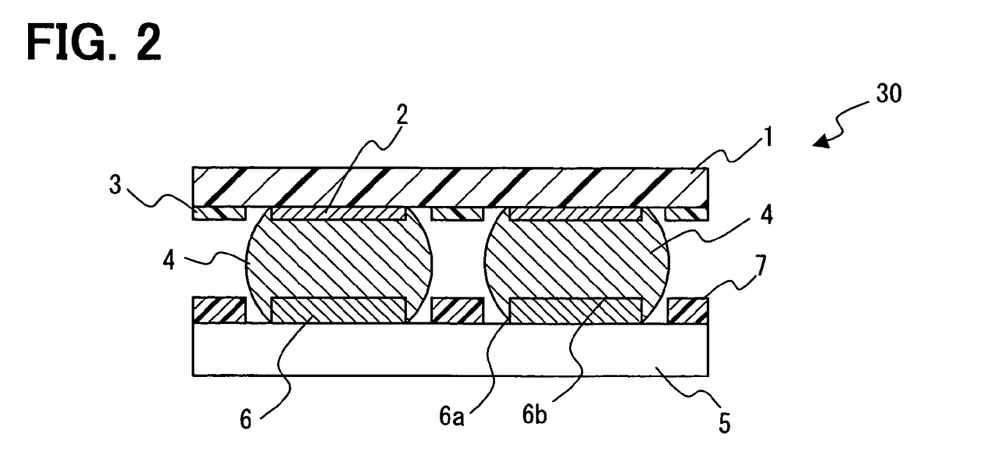
FIG. 2 is a partial cross sectional view showing a state where the circuit device is mounted on the printed circuit board according to the first embodiment.

A first embodiment of the present invention is explained with reference to drawings as follows. FIG. 1A is a partial cross sectional view showing a schematic constitution of a printed circuit board according to the first embodiment of the present invention. FIG. 1B is a partial cross sectional view showing a schematic constitution of a circuit device according to the first embodiment of the present invention. FIG. 2 is a partial cross sectional view showing a schematic constitution of a state where the circuit device is mounted on the printed circuit board according to the first embodiment of the present invention.

Firstly, an electric device 30 as an object of inspection according to the embodiment of the present invention is explained. The electric device 30 includes a printed circuit board 10 and a circuit device 20.

As shown in FIG. 1A, the printed circuit board 10 according to the embodiment of the present invention includes a printed circuit board side solder 4b, a printed circuit board side land 6, a substrate 5, a printed circuit board side resist 7 and the like.

The substrate 5 is an insulation substrate made of ceramics, thermoplastic resin or the like. Multiple printed circuit board side lands 6, the printed circuit board side resist 7, a wiring pattern as a patterned conductive layer (not shown) and the like are disposed on a mounting surface of the substrate 5, on which the circuit device 20 is mounted.

Multiple printed circuit board side lands 6 are conductive members for electrically connecting to the wiring pattern. Each printed circuit board side land 6 is formed at a position corresponding to a circuit device side solder 4a of the circuit device 20, which is explained later. The printed circuit board side solder 4b is formed on a land top portion 6b (i.e., a top portion 6b of the land 6) of the printed circuit board side land 6. The printed circuit board side solder 4b and a circuit device side solder 4a of the circuit device 20 are melted and normally bonded together in a reflow process, so that a solder bump 4 is formed. Thus, the printed circuit board side land 6 and the circuit device side solder 4a are electrically connected. Here, the thickness of the printed circuit board side land 6 is preferably set to be about 40 µm in order to form a horizontal tomographic image of the printed circuit board side land 6 and a periphery of the printed circuit board side land 6, as described later.

The printed circuit board side resist 7 is formed between multiple printed circuit board side lands 6 so that the solder bump 4 is prevented from adhering to a wiring pattern other than the printed circuit board side lands 6, or multiple printed circuit board side lands 6 are prevented from being connected together with the solder bump 4 or the like.

In the present invention, existence or nonexistence of the solder bump 4 on the land side portion 6a of the printed circuit board side land 6 is inspected in order to inspect whether the printed circuit board side land 6 and the circuit device side solder 4a are normally connected together, i.e., whether the solder bump 4 is formed. Thus, when the existence or nonexistence of the solder bump 4 on the land side portion 6a of the printed circuit board side land 6 is inspected, it is required that the solder bump 4 is formed on the land side portion 6a (i.e., the side portion 6a of the land 6), the solder bump 4 being formed by melting and bonding the circuit device side solder 4a and the printed circuit board side solder 4b in a case where the circuit device side solder 4a and the printed circuit board side solder 4b are melted and normally bonded together. A detailed inspection method is described later.

Accordingly, in a state where the circuit device side solder 4a and the printed circuit board side solder 4b are normally connected together, it is required to set a predetermined distance between the printed circuit board side resist 7 and the printed circuit board side land 6 for forming the solder bump 4 on the land side portion 6a, the solder bump 4 being formed by melting and bonding the circuit device side solder 4a and the printed circuit board side solder 4b.

The distance between the printed circuit board side resist 7 and the printed circuit board side land 6 is set to be about 20 µm. In this case, the solder bump 4 is formed on the land side portion 6a in a state where the circuit device side solder 4a and the printed circuit board side solder 4b are normally connected together.

Preferably, the distance between the printed circuit board side resist 7 and the printed circuit board side land 6 is set to be about 30 μm. By setting the distance between the printed circuit board side resist 7 and the printed circuit board side land 6 to be about 30 μm, the solder bump 4 is reliably formed on the land side portion 6a in a state where the circuit device side solder 4a and the printed circuit board side solder 4b are normally connected together.

When the printed circuit board side resist 7 and the printed circuit board side land 6 are formed, some errors of the formed position of the printed circuit board side resist 7 or the printed circuit board side land 6 may be observed. When the error of the formed position of the printed circuit board side resist 7 or the printed circuit board side land 6 is occurred, the solder bump 4 may not be formed on the land side portion 6a even in a state where the circuit device side solder 4a and the printed circuit board side solder 4b are normally connected together. Thus, preferably, the distance between the printed circuit board side resist 7 and the printed circuit board side land 6 is set to be about 75 μm±30 μm. By setting the distance between the printed circuit board side resist 7 and the printed circuit board side land 6 to be about 75 μm±30 μm, the solder bump 4 is reliably formed on the land side portion 6a in a state where the circuit device side solder 4a and the printed circuit board side solder 4b are normally connected together even when the error of the formed position of the printed circuit board side resist 7 or the printed circuit board side land 6 is occurred. Here, a structure that the printed circuit board side resist 7 is formed to separate from the printed circuit board side land 6 by a distance therebetween is called a normal resist structure.

The circuit device 20 according to this embodiment is a semiconductor circuit device such as a BGA (i.e., ball grid-array) and a CSP (i.e., chip scale package). As shown in FIG. 1B, the circuit device 20 includes an interposer 1, a circuit device side land 2, a circuit device side resist 3, a circuit device side solder 4a and the like.

A bare chip is mounted on one side of the interposer 1. A wiring pattern is formed on a mounting surface of the interposer 1 for mounting the bare chip thereon. The wiring pattern is directly connected to or electrically connected with using a wire to an electrode of the bare chip when the bare chip is mounted on the interposer 1. A through hole and the like are formed in the interposer 1. The interposer 1 further includes the circuit device side land 2 electrically connected to the wiring pattern through the through hole.

The circuit device side land 2 is formed on a position corresponding to the printed circuit board side solder 4b. The circuit device side solder 4a (i.e., a solder ball) is formed on the circuit device side land 2. The circuit device side solder 4a provides the solder bump 4 by melting and bonding together with the printed circuit board side solder 4b, i.e., the circuit device side solder 4a and the printed circuit board side solder 4b are melted and bonded together so that the solder bump 4 is formed.

The circuit device 20 is sealed and molded with a resin mold in a state where the bare chip is mounted on the interposer 1 and the bare chip and the wiring pattern is electrically connected together.

Figure 3:
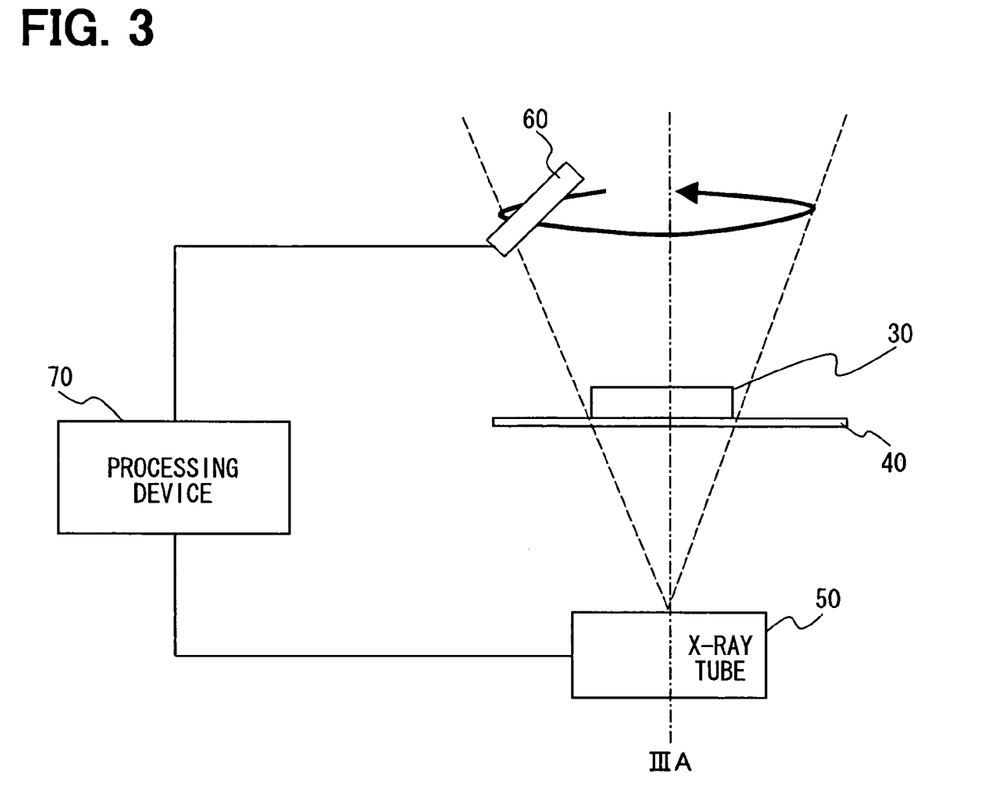
FIG. 3 is a schematic block diagram showing a X-ray inspection device according to the first embodiment.

Next, the X-ray inspection device according to the embodiment is explained. FIG. 3 is a block diagram showing a schematic constitution of the X-ray inspection device according to the first embodiment of the present invention. The X-ray inspection device according to this embodiment irradiates the X-ray to an object of inspection from an oblique direction so that a three-dimensional tomographic photography of the object of inspection is performed. Here, the object of inspection is the electric device 30, which is composed of the printed circuit board 1 with the circuit device 20. Specifically, the object of inspection is the solder connection portion between the printed circuit board 1 and the circuit device 20. Thus, the X-ray inspection device is a transmission type three-dimensional X-ray inspection device (hereafter called a three-dimensional oblique CT) for inspecting the object of inspection.

As shown in FIG. 3, the X-ray inspection device includes a stage 40, a X-ray tube 50, a camera 60, a processing device 70 and the like.

The X-ray irradiated from the X-ray tube 50 is capable of transmitting through the stage 40. The stage mounts the electric device 30 composed of the printed circuit board 10 and the circuit device 20 as the object of inspection.

The X-ray tube 50 is a X-ray source for irradiating the X-ray toward the electric device 30. The wide expanded X-ray shown as a dotted line in FIG. 3 is irradiated. Preferably, a micro-focus X-ray source having a small focal diameter is used as the X-ray tube 50 to obtain a clear horizontal tomographic image.

The camera 60 is arranged opposite to the X-ray tube 50 from the electric device 30 and the stage 40. The camera 60 includes a camera driving device, which is not shown. The camera driving device rotates the camera 60 around an axis IIIA as a rotation center shown as a dashed line. The camera 60 detects a projection image of the electric device 30 (i.e., the solder connection portion) on the stage 40 by using the X-ray transmitted through the stage 40 and the electric device 30, the X-ray which is irradiated from the X-ray tube 50.

The processing device 70 is mainly composed of a micro-computer, and includes a memory such as a ROM and a RAM, an interface circuit and a bus line for transmitting a data. In the memory, a program corresponding to functions for executing in the processing device 70 is memorized.

The processing device 70 outputs a control signal to the X-ray tube 50 for controlling radiation of the X-ray in accordance with the program memorized in the memory. Further, the processing device 70 outputs a driving signal to the camera driving device for instructing rotation of the camera 60, and receives an image signal showing a projection image detected by the camera 60 so that the processing device 70 forms a three-dimensional image, and the like.

The processing device 70 forms the horizontal tomographic image of the printed circuit board side land 6 and the periphery of the printed circuit board side land 6 on the basis of the formed three-dimensional image so that the solder connection portion is inspected. The processing device 70 inspects the floating failure of the circuit device side solder 4a and the failure that the circuit device side solder 4a and the printed circuit board side solder 4b are partially bonded together, (hereafter called solder wettability failure).

Figure 4:
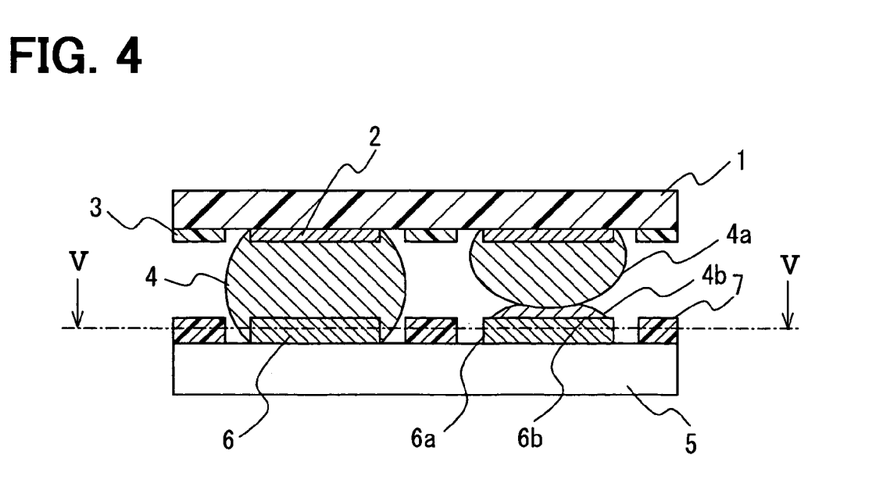
FIG. 4 is a partial cross sectional view explaining the connection state of the solder connection portion when the circuit device is mounted on the printed circuit board, according to the first embodiment.
Figure 5:
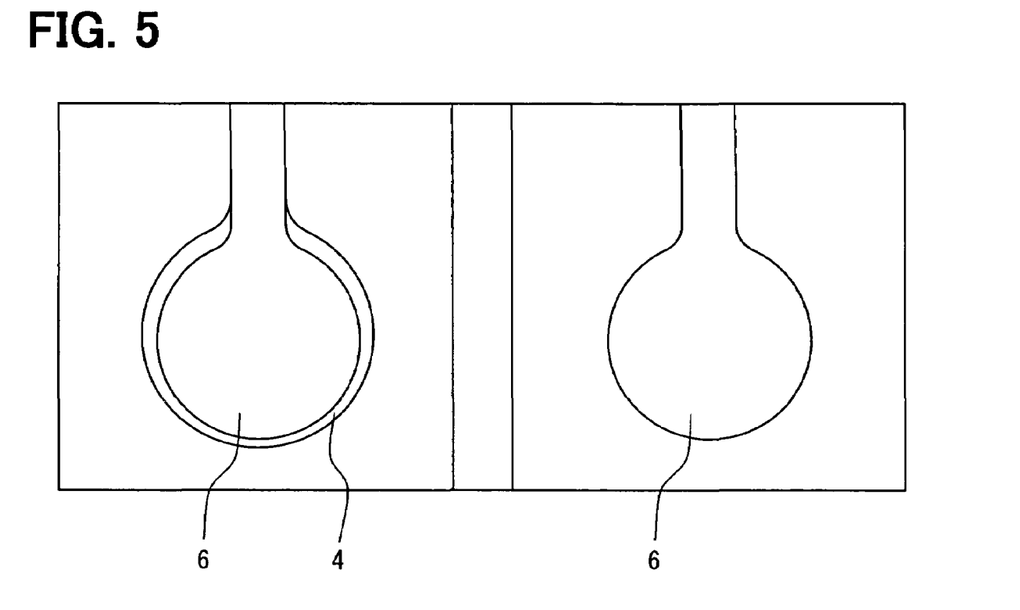
FIG. 5 is a horizontal tomographic image of the solder connection portion taken along line V-V in FIG. 4, which is formed by the X-ray inspection device according to the first embodiment.

The inspection method for inspecting the state of the solder connection portion by using the X-ray inspection device is explained with respect to the drawings. FIG. 4 is a partial cross sectional view showing the state that the circuit device 20 is mounted on the printed circuit board 10 in order to explain the connection state of the solder connection portion. FIG. 5 is the horizontal tomographic image of the solder connection portion formed by the X-ray inspection device. The horizontal tomographic image is a cross sectional view showing the electric device 30 taken along line V-v in FIG. 4.

Firstly, the horizontal tomographic image of the printed circuit board side land 6 and the periphery of the printed circuit board side land 6 is formed. The processing device 70 outputs the control signal to the X-ray tube 50 for irradiating the X-ray. Further, the processing device 70 outputs the driving signal to the camera driving device for rotating the camera 60. Here, the X-ray tube 50 is fixed on the table 40. The X-ray tube 50 irradiates the wide expanded X-ray shown as the dotted line in FIG. 3 toward the electric device 30 after the control signal is outputted. The camera driving device rotates the camera 60 around the axis IIIA as the rotation center after the driving signal is outputted.

The processing device 70 obtains and memorizes the image signal at predetermined intervals into the memory in a state where the X-ray tube 50 irradiates the X-ray and the camera 60 is rotated around the axis IIIA as the center, the image signal showing the projection image of the electric device 30 (i.e., the solder connection portion), which is outputted from the camera 650. Then, the processing device 70 processes the image signal memorized in the memory so that the three-dimensional image of the electric device 30 (i.e., the solder connection portion) is formed. Further, the processing device 70 processes the formed three-dimensional image so that the horizontal tomographic image of the printed circuit board side land 6 and the periphery of the printed circuit board side land 6, i.e., the horizontal tomographic image in a predetermined range including the printed circuit board side land 6 is obtained. Here, the horizontal tomographic image of the predetermined range is, for example, the horizontal tomographic image in the predetermined range including one printed circuit board side land 6 or the horizontal tomographic image in the predetermined range including multiple printed circuit board side lands 6.

To explain the horizontal tomographic image easily, the solder connection portion shown in FIG. 4 is used for the explanation. In the solder connection portion shown in FIG. 4, a view on the left side of the drawing shows the normal connection state, and a view on the right side of the drawing shows the connection state having the solder wettability failure. As shown in FIG. 4, when the circuit device side solder 4a and the printed circuit board side solder 4b are normally connected together, i.e., when the solder connection portion is in the normal connection state, the solder bump 4 is formed on the land side portion 6a. On the other hand, when the circuit device side solder 4a and the printed circuit board side solder 4b are not normally connected together, i.e., when the solder connection portion is in the connection state having the solder wettability failure, possibility to form the solder bump 4 on the land side portion 6a is low.

When the X-ray inspection device according to the embodiment forms the horizontal tomographic image of the printed circuit board side land 6 and the periphery of the printed circuit board side land 6 as the solder connection portion taken along line V-V n FIG. 4, the image shown in FIG. 5 is obtained. In the horizontal tomographic image shown in FIG. 5, the solder bump 4 is formed on the periphery of the printed circuit board side land 6 in case of the solder connection portion shown on the left side of the drawing as the normal connection state. On the other hand, the solder bump 4 is not formed on the periphery of the printed circuit board side land 6 in case of the solder connection portion shown on the right side of the drawing as the connection state having the solder wettability failure.

When the solder connection portion is inspected by using the horizontal tomographic image shown in FIG. 5, the processing device 70 inspects the solder connection portion on the basis of the occupancy rate of the solder bump 4 in the formed horizontal tomographic image of the predetermined range.

Regarding the floating failure of the circuit device side solder 4a, possibility to form the solder bump 4 on the land side portion 6a of the printed circuit board side land 6 is low. Thus, the horizontal tomographic image of the printed circuit board side land 6 and the periphery of the printed circuit board side land 6 is formed so that the solder connection portion is inspected. Thus, the inspection is performed.

Thus, the printed circuit board 10 has the normal resist structure, and the horizontal tomographic image of the printed circuit board side land 6 and the periphery of the printed circuit board side land 6 is formed so that the solder connection portion is inspected. In this case, not only the floating failure but also the connection state having the solder wettability failure are inspected, so that the failure of the solder connection portion can be reliably inspected.

The above-described embodiment describes an example that the horizontal tomographic image (i.e., the horizontal tomographic image taken along line V-V in FIG. 4) at one point is formed so that the failure of the solder connection portion is inspected. The present invention is not limited to this example. The horizontal tomographic image at multiple points may be formed so that the failure of the solder connection portion is inspected. When the horizontal tomographic image at multiple points is formed so that the failure of the solder connection portion is inspected, the detection accuracy is improved. When the horizontal tomographic image at multiple points is formed, firstly, the land top portion 6b of the printed circuit board side land 6 is detected. Then, the horizontal tomographic image at multiple points (for example, at 10 μm intervals) from the land top portion 6b toward the substrate 5 may be formed.

Further, when a unit for inspecting the connection state of the solder connection portion, i.e., a unit for forming the horizontal tomographic image is a unit of the printed circuit board side land 6, the detection accuracy is improved. Further, when the inspection is performed in each unit of multiple printed circuit board side lands 6, the detection time is shortened.

Figure 6:
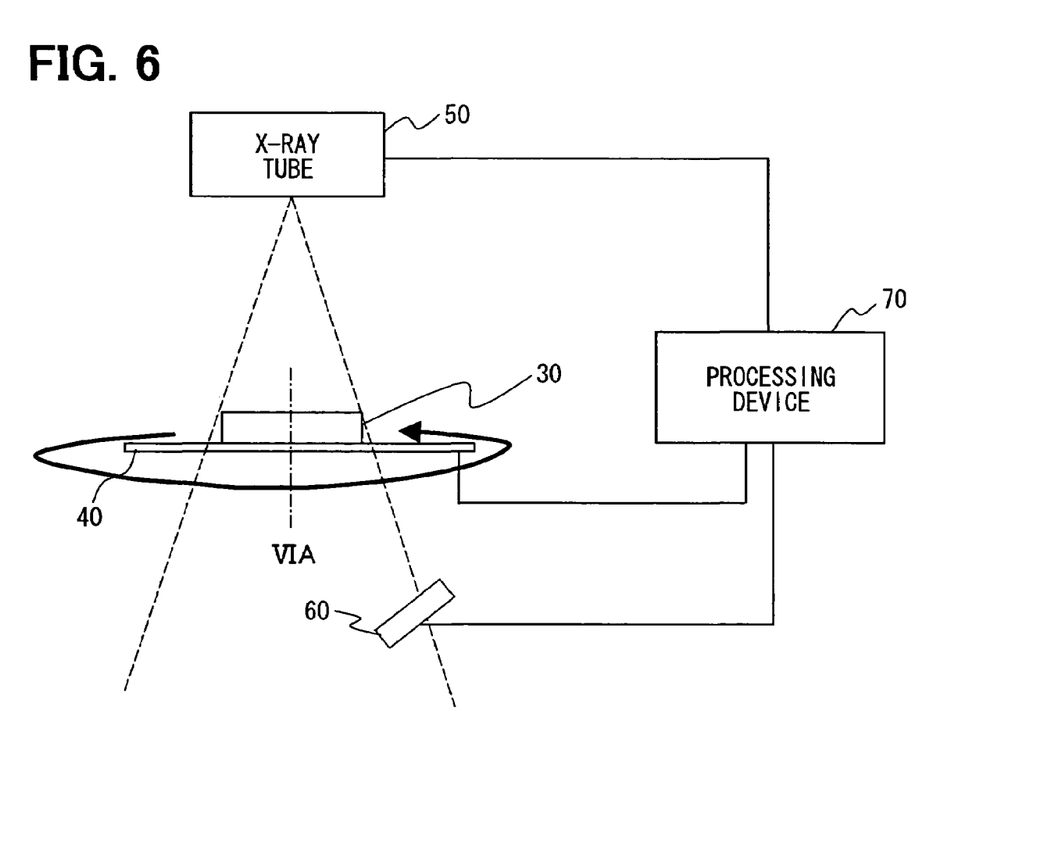
FIG. 6 is a schematic block diagram showing a X-ray inspection device according to a modification of the first embodiment.

The above-described embodiment explains an example that the camera 60 is rotated for forming the horizontal tomographic image. However, the present invention is not limited to this example. The stage 40 together with the electric device 30 may be rotated as a modification of the embodiment, instead of rotating the camera 60.

FIG. 6 is a block diagram showing a schematic constitution of a X-ray inspection device according to the modification of the first embodiment of the present invention. Here, the X-ray inspection device according to the modification has many common characteristics to the above-described embodiment. The detailed description of the common characteristics is skipped, and the difference is mainly described as follows. In this modification, the stage 40 together with the electric device 30 is rotated, which is the difference from the above-described embodiment.

As shown in FIG. 6, the X-ray inspection device according to the modification includes the stage 40, the X-ray tube 50, the camera 60, the processing device 70 and the like.

The X-ray irradiated from the X-ray tube 50 is capable of transmitting through the stage 40. The stage 40 mounts the electric device 30 as the object of inspection composed of the printed circuit board 10 and the circuit device 20. The stage 40 includes a stage driving device, which is not shown, so that the stage 40 is rotated around the axis VIA shown as the dashed line.

The processing device 70 is mainly composed of the microcomputer. The processing device 70 includes the memory such as the ROM and the RAM, the interface, the bus line for transmitting the data and the like. The memory memorizes the program corresponding to the functions for performing in the processing device 70.

The processing device 70 outputs the control signal to the X-ray tube 50 for controlling radiation of the X-ray in accordance with the program memorized in the memory. Further, the processing device 70 outputs the driving signal to the stage driving device for instructing rotation of the stage 40, and receives an image signal showing a projection image detected by the camera 60 so that the processing device 70 forms a three-dimensional image, and the like.

The processing device 70 forms the horizontal tomographic image of the printed circuit board side land 6 and the periphery of the printed circuit board side land 6 on the basis of the formed three-dimensional image so that the solder connection portion is inspected. The processing device 70 inspects the floating failure of the circuit device side solder 4a and the failure that the circuit device side solder 4a and the printed circuit board side solder 4b are partially bonded together.

Second Embodiment

Figure 7A:
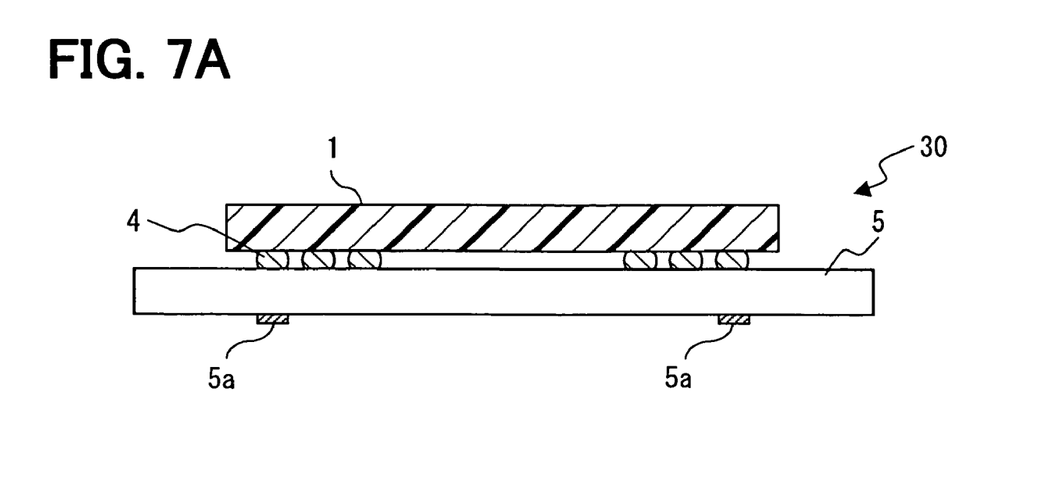
FIG. 7A is a partial cross sectional view showing a state where the circuit device is mounted on the printed circuit board according to a second embodiment of the present invention.
Figure 7B:
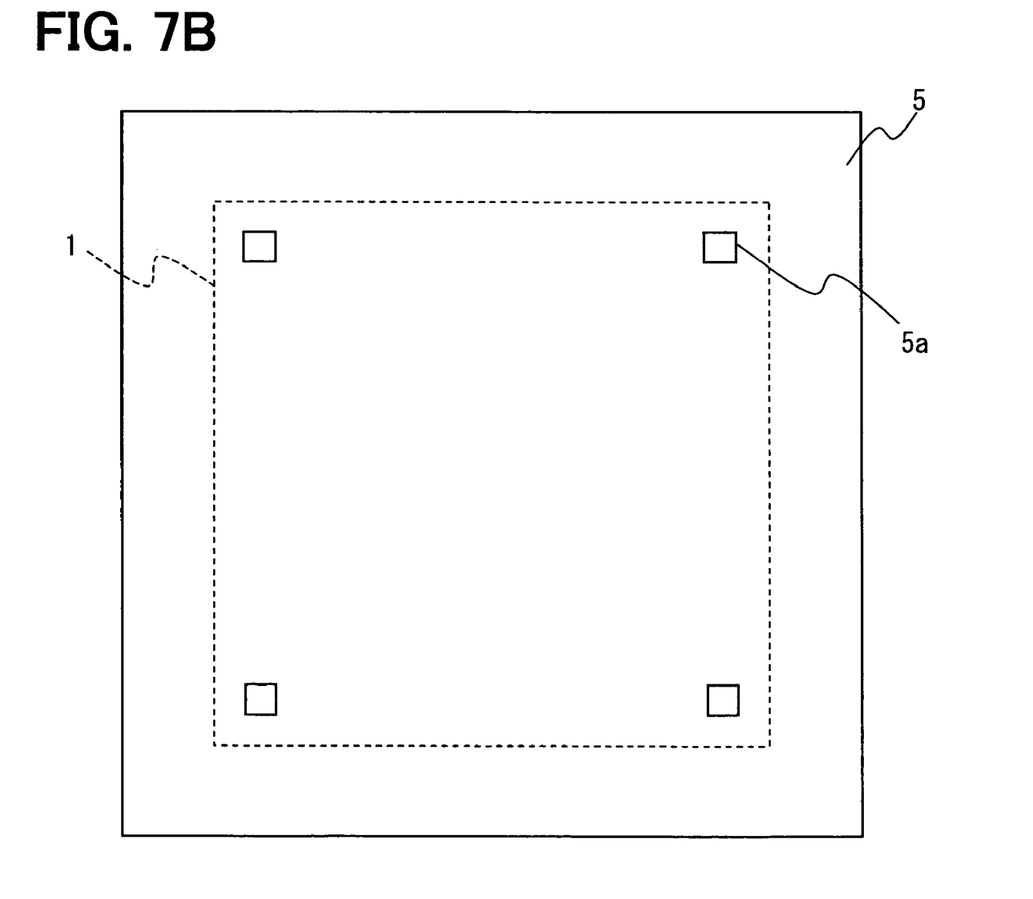
FIG. 7B is a partial plan view showing the printed circuit board according to the second embodiment.
Figure 8:
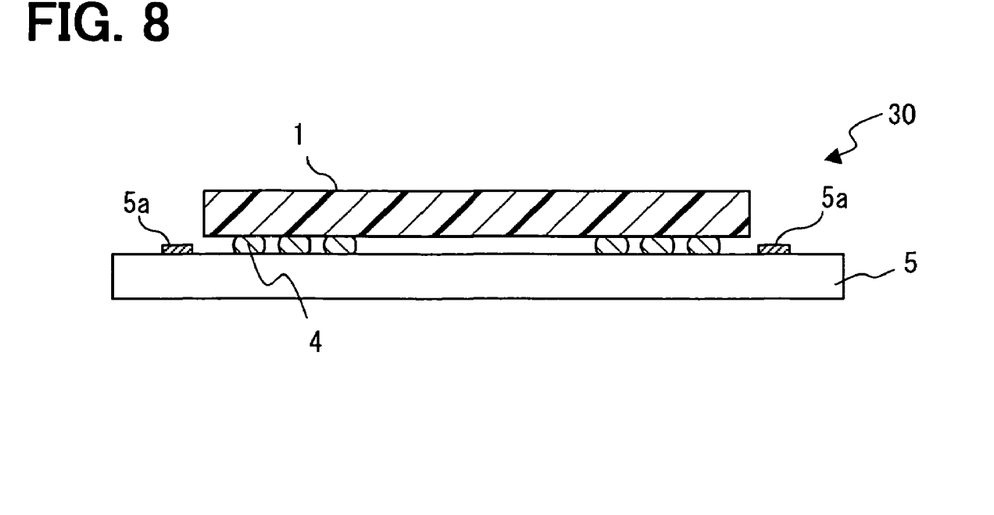
FIG. 8 is a partial cross sectional view showing a case where a warpage compensation mark of the circuit device and the printed circuit board is arranged at a different position, according to the second embodiment.
Figure 9:
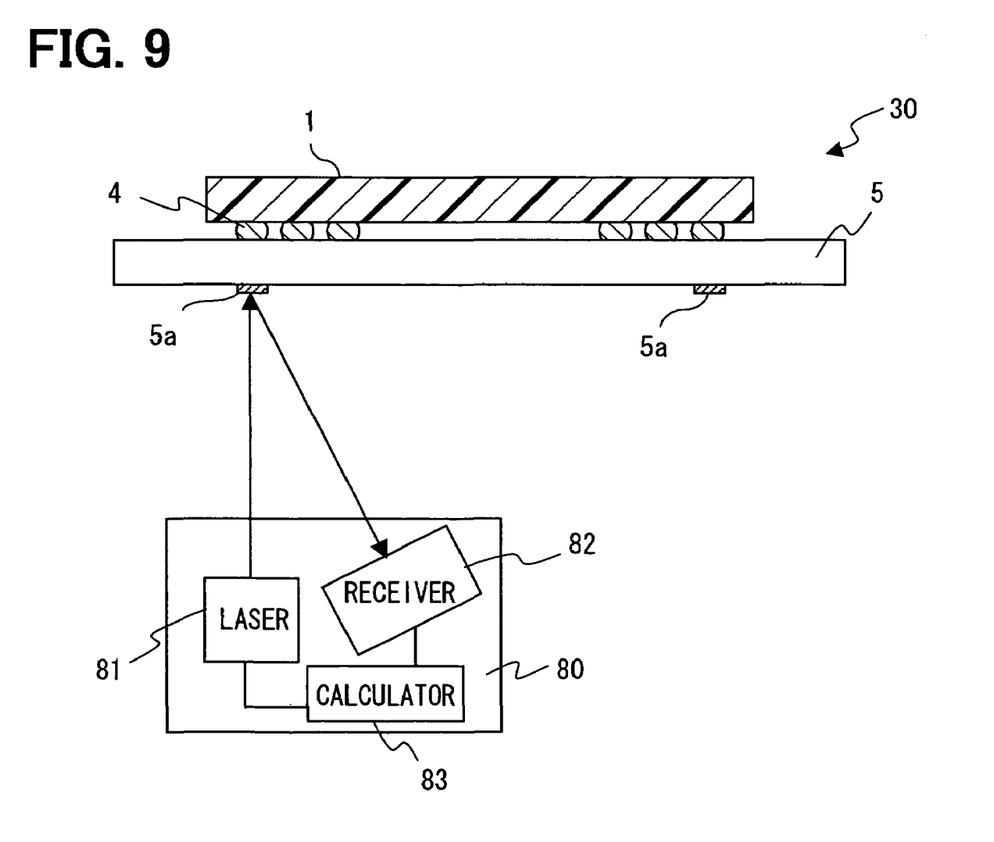
FIG. 9 is a schematic view showing a warpage measurement device according to the second embodiment.

Next, second embodiment of the present invention is explained with reference to the drawings. FIG. 7A is a partial cross sectional view showing a schematic constitution of a state that the circuit device is mounted on the printed circuit board according to the second embodiment of the present invention. FIG. 7B is a partial plan view showing a schematic constitution of the printed circuit board according to the second embodiment of the present invention. FIG. 8 is a partial cross sectional view showing a case where the warpage compensation marks of the circuit device and the printed circuit board are arranged at different points, according to the second embodiment of the present invention. FIG. 9 is an explanation view showing a schematic constitution of a warpage measurement device according to the second embodiment of the present invention.

Here, the X-ray inspection device according to the second embodiment inspects the connection state of the solder connection portion in consideration of the warpage of the printed circuit board. The X-ray inspection device according to the second embodiment has many common characteristics to the above-described first embodiment. The detailed description of the common characteristics is skipped, and the difference is mainly described as follows. In the second embodiment, the horizontal tomographic image is compensated in accordance with the warpage of the printed circuit board 10, which is the difference from the above-described first embodiment.

As shown in FIGS. 7A and 7B, the electric device 30 includes the printed circuit board 10 and the circuit device 20. The printed circuit board 10 includes warpage compensation marks 5a made from a conductive pattern such as copper pattern shown in FIGS. 1A to 1B. The warpage compensation marks 5a are disposed on at least three points of a surface of the printed circuit board 10 so that the warpage of the printed circuit board 10 is measured (In this embodiment, the marks 5a are disposed at four points). Ti is preferred that the warpage compensation marks 5a are disposed on a surface opposite to the mounting surface of the circuit device 20, and disposed at positions corresponding to four corners of the circuit device 20 so that the warpage of the printed circuit board 10 at the printed circuit board side land 6 and the periphery of the printed circuit board side land 6 is appropriately reflected to the compensation of the horizontal tomographic image.

As shown in FIG. 8, the warpage compensation mark 5a may be formed on the mounting surface side of the printed circuit board 10, on which the circuit device 20 is mounted. Even in this case, the warpage compensation mark 5a is preferably disposed near the circuit device 20.

The warpage measurement device 80 is a conventional laser warpage measurement device. As shown in FIG. 9, the device 80 includes a laser beam emission portion 81, a laser beam receiving portion 82, a warpage amount calculation portion 83 and the like. When the warpage of the printed circuit board 10 is measured by the warpage measurement device 80, the warpage measurement device 80 or the printed circuit board 10 is displaced, the laser beam is irradiated from the laser beam emission portion 81 toward each warpage compensation mark 5a, and the laser beam reflected by the warpage compensation mark 5a is received by the laser beam receiving portion 82.

The warpage amount calculation portion 83 detects the height of each warpage compensation mark 5a (i.e., a distance from the laser beam emission portion 81) by using the laser beam emission portion 81 and the laser beam receiving portion 82. The warpage amount calculation portion 83 calculates positioning coordinates of each warpage compensation mark 5a on the basis of the X-X positioning coordinates of the warpage compensation mark 5a preliminarily determined and the detected height of the warpage compensation mark 5a. Further, the warpage amount calculation portion 83 calculates a virtual plane of the printed circuit board 10 by using the calculated positioning coordinates. Then, the warpage amount calculation portion 83 calculates the warpage amount of the printed circuit board 10, i.e., a gradient of the printed circuit board 10 by comparing the virtual plane and the plane of the printed circuit board 10 as a normal state (i.e., a state having small warpage).

When the warpage amount of the printed circuit board 10 is calculated, the horizontal tomographic image is compensated on the basis of the warpage amount. Specifically, as described above embodiment, the horizontal tomographic image of the plane, which is tilted in accordance with the warpage amount calculated by the warpage measurement device 80, when the horizontal tomographic image of the printed circuit board side land 6 and the periphery of the printed circuit boar side land 6 is formed.

Figure 10A:
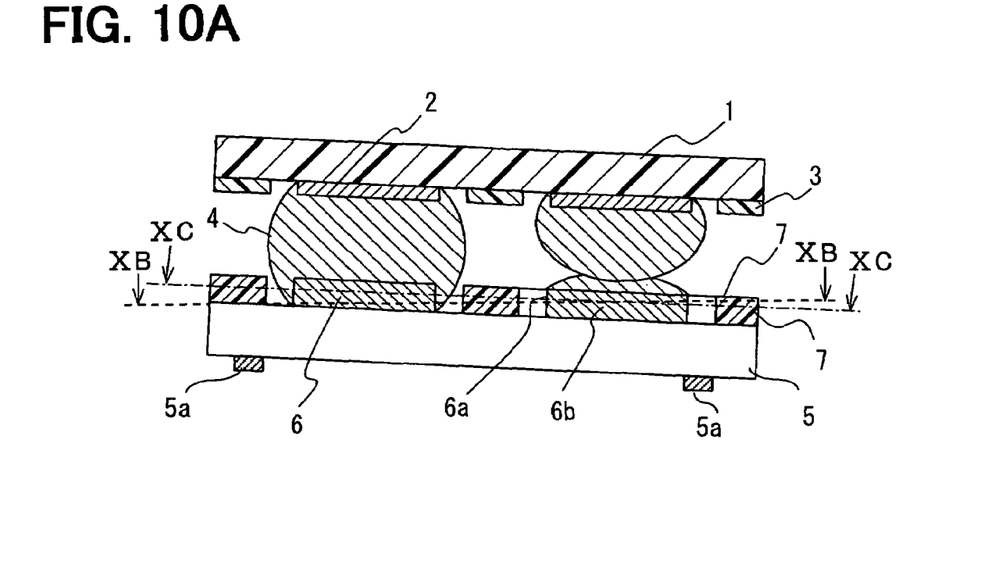
FIG. 10A is a partial cross sectional view showing a state where the circuit device is mounted on the printed circuit board having the warpage.
Figure 10B:
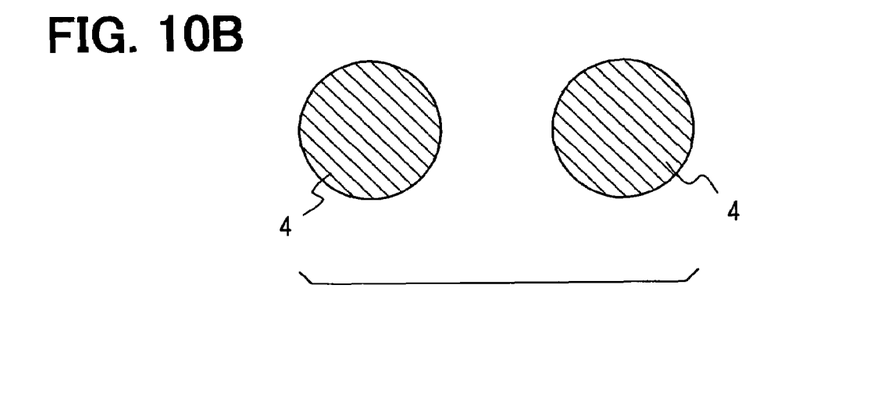
FIG. 10B is a horizontal tomographic image of the solder connection portion taken along line XB-XB in FIG. 10A.
Figure 10C:
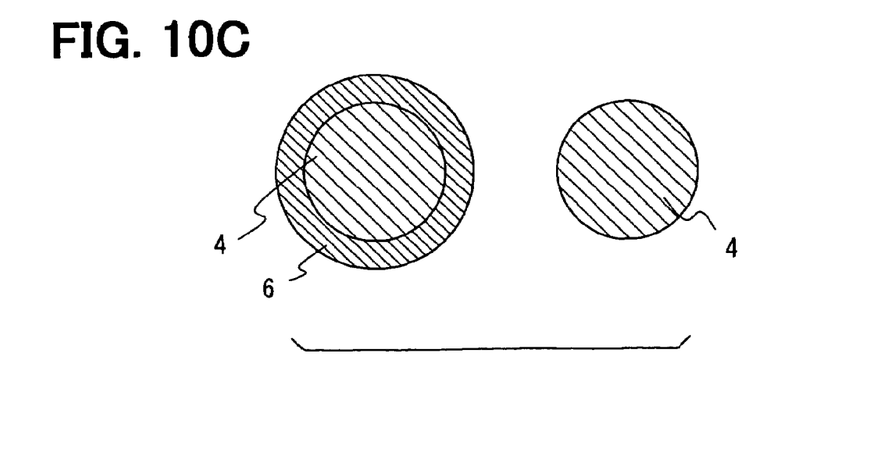
FIG. 10C is a horizontal tomographic image of the solder connection portion taken along line XC-XC in FIG. 10A.

Here, difference of the horizontal tomographic image is explained with reference to FIGS. 10A and 10B, the difference between a case where the warpage of the printed circuit board 10 is considered and a case where the warpage is not considered. FIG. 10A is a partial cross sectional view showing the state that the circuit device is mounted on the printed circuit board having the warpage in order to explain the connection state of the solder connection portion. FIG. 10B shows the horizontal tomographic image taken along line XB-XB in FIG. 10A, and FIG. 10C shows the horizontal tomographic image taken along line XC-XC in FIG. 10A.

When the horizontal tomographic image is formed without consideration for the warpage of the printed circuit board 10, as shown in FIG. 10B, the horizontal tomographic image of the plane taken along a dotted line XB-XB. In this printed circuit board 10, the light side view of the drawing represents the normal connection state, and the right side view of the drawing represents the connection state having the solder wettability failure. However, as shown in FIG. 10B, although the left side view of the drawing represents the normal connection state of the solder connection portion, the left side view is decided as the failure because of the warpage of the printed circuit board 10.

However, as described in this embodiment, the decision error is prevented by forming the horizontal tomographic image with consideration for the warpage of the printed circuit board 10. Specifically, the horizontal tomographic image of the printed circuit board 10 shown in FIG. 10A on the plane is formed, the plane tilted in accordance with the warpage calculated by the warpage measurement device 80. In this case, as shown in FIG. 10C, the horizontal tomographic image on the plane taken along a dashed line XC-XC is formed. As shown in FIG. 10C, by forming the horizontal tomographic image with consideration for the warpage of the printed circuit board 10, the connection state of the solder connection portion is appropriately outputted. Thus, the connection state of the solder connection portion can be inspected much accurately without misjudgment even when the warpage of the printed circuit board is occurred.

The present invention provides a X-ray inspection device and a X-ray inspection method as follows.

A X-ray inspection device for inspecting a solder connection portion between a circuit device having a solder ball and a printed circuit board having a land, the device includes: X-ray irradiating means for irradiating X-ray to the solder connection portion when the solder ball of the circuit device is bonded to the land of the printed circuit board for forming the solder connection portion between the solder ball and the land; X-ray detecting means for detecting the X-ray transmitted through the solder connection portion and for outputting a detection signal corresponding to the detected X-ray; and image forming means for forming and outputting a horizontal tomographic image of the solder connection portion on the basis of the detection signal. The horizontal tomographic image shows existence or nonexistence of a solder bump disposed on a side of the land.

When the circuit device having a solder ball is mounted on the printed circuit board including a land disposed separately from the resist, the solder ball is melted so that the solder ball is normally bonded to the land. In this state, the solder bump is formed on the top and on the side of the land. However, when the solder ball and the land are not completely bonded together so that the solder ball is separated from the land or the solder ball is partially bonded to the land, the solder bump is hardly formed on the side of the land. Accordingly, the X-ray is irradiated to the solder connection portion in a state where the circuit device is mounted on the printed circuit board, and the horizontal tomographic image showing existence or nonexistence of the solder bump is formed and outputted on the basis of the X-ray transmitted through the solder connection portion. Thus, not only the floating failure of the solder ball but also the failure that the solder ball is partially bonded to the land can be inspected. Therefore, the failure of the solder connection portion is reliably inspected.

Alternatively, the solder ball may include a plurality of ball portions, the land may include a plurality of land portions, and the solder connection portion may include a plurality of connection parts, each of which is provided by each ball portion and the corresponding land portion. The image forming means forms and outputs the horizontal tomographic image in each connection part. Alternatively, the image forming means may form and output the horizontal tomographic image in each unit including a predetermined number of the connection parts.

Alternatively, the image forming means may form and output the horizontal tomographic image in a predetermined range including the side of the land and a periphery of the land, and the image forming means includes determination means for checking quality of the solder connection portion on the basis of an occupancy rate of the solder bump on the side of the land in the horizontal tomographic image of the predetermined range. Thus, existence or nonexistence of the solder on the side of the land is reliably inspected, so that the quality of the connection state of the solder connection portion is checked.

Alternatively, the land is disposed on the printed circuit board, and the land includes a top, which faces the circuit device. The horizontal tomographic image of the solder connection portion includes a plurality of image parts. Each image part represents a corresponding cross section of the solder connection portion at a corresponding distance from the top of the land toward the printed circuit board. The cross section is parallel to the printed circuit board.

Alternatively, the X-ray inspection device further includes: warpage measurement means for measuring a warpage amount of the printed circuit board and for outputting a warpage signal showing the warpage amount. The image forming means compensates the horizontal tomographic image in accordance with the warpage signal. The warpage of the printed circuit board may be observed since thermal expansion coefficient of each component is different. When the warpage of the printed circuit board is occurred, the horizontal tomographic image at a position shifted from the land may be formed in a case where the horizontal tomographic image showing existence or nonexistence of the solder on the side of the land is formed. Thus, when the horizontal tomographic image at the position shifted from the land is formed, the connection state of the solder connection portion may be misjudged. However, in the above device, even when the warpage of the printed circuit board is occurred, the connection state of the solder connection portion is inspected much accurately without misjudgment.

Alternatively, the printed circuit board may further include at least three warpage compensation marks on a surface of the printed circuit board, and the warpage measurement means includes laser beam measurement means, which irradiates a laser beam to the warpage compensation marks so that the warpage amount of the printed circuit board is measured.

Further, a X-ray inspection method for inspecting a solder connection portion between a circuit device and a printed circuit board by using a X-ray inspection device is provided. The circuit device includes a solder ball disposed on a surface of the circuit device facing the printed circuit board, and the printed circuit board includes a land disposed on a position of a surface of the printed circuit board corresponding to the solder ball. The method includes the steps of: irradiating a X-ray to the solder connection portion by using the X-ray inspection device when the solder ball of the circuit device is bonded to the land of the printed circuit board for forming the solder connection portion between the solder ball and the land; detecting the X-ray transmitted through the solder connection portion; outputting a detection signal corresponding to the detected X-ray; and forming and outputting a horizontal tomographic image of the solder connection portion on the basis of the detection signal. The horizontal tomographic image shows existence or nonexistence of a solder bump disposed on a side of the land.

Thus, when the circuit device having a solder ball is mounted on the printed circuit board having a land separated from the resist, the solder ball and the land are normally bonded. In this state, the solder bump is formed on the top and the side of the land. However, when the solder ball and the land are not completely bonded together so that the solder ball is separated from the land, or the solder ball is partially bonded to the land, the solder bump is not substantially formed on the side of the land. Accordingly, the horizontal tomographic image showing existence or nonexistence of the solder bump is formed and outputted, the solder bump which is disposed on the side of the land separated from the resist. Thus, not only the floating failure of the solder ball but also the failure that the solder ball is partially bonded to the land can be inspected. Therefore, the failure of the solder connection portion is reliably inspected.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. An X-ray inspection method for inspecting a solder connection portion between a circuit device and a printed circuit board by using an X-ray inspection device, wherein the circuit device includes a solder ball disposed on a surface of the circuit device facing the printed circuit board, and wherein the printed circuit board includes a land disposed on a position of a surface of the printed circuit board corresponding to the solder ball, the method comprising the steps of:
    irradiating an X-ray to the solder connection portion by using the X-ray inspection device when the solder ball of the circuit device is bonded to the land of the printed circuit board for forming the solder connection portion between the solder ball and the land;
    detecting the X-ray transmitted through the solder connection portion;
    outputting a detection signal corresponding to the detected X-ray;
    forming and outputting a horizontal tomographic image of the solder connection portion on the basis of the detection signal;
    measuring a warpage amount of the printed circuit board;
    compensating the horizontal tomographic image in accordance with the warpage amount; and
    determining solder wettability failure when no solder bump is disposed in contact with a surface of the land that is intersected by a horizontal plane of the horizontal tomographic image, wherein
    the horizontal tomographic image shows existence or nonexistence of the solder bump disposed in contact with a surface of the land that is intersected by a horizontal plane of the horizontal tomographic image,
    the land has a thickness about 40 μm,
    the printed circuit board further includes a resist, which is separated from the land,
    a distance between the land and the resist is in a range between 20 μm and 105 μm, and
    the printed circuit board further includes at least warpage compensation marks on a surface of the printed circuit board to measure the warpage amount.

2. The X-ray inspection method according to claim 1, wherein
    a distance between the land and the resist is about 30 μm.

3. The X-ray inspection method according to claim 1, wherein
    a distance between the land and the resist is about 75 μm±30 μm.

4. The X-ray inspection method according to claim 1, wherein
    the solder ball includes a plurality of ball portions,
    the land includes a plurality of land portions,
    the solder connection portion includes a plurality of connection parts, each of which is provided by each ball portion and the corresponding land portion, and
    the horizontal tomographic image is formed in each connection part.

5. The X-ray inspection method according to claim 1, wherein
    the solder ball includes a plurality of ball portions,
    the land includes a plurality of land portions,
    the solder connection portion includes a plurality of connection parts, each of which is provided by each ball portion and the corresponding land portion, and
    the horizontal tomographic image is formed in each unit including a predetermined number of the connection parts.

6. The X-ray inspection method according to claim 1, further comprising the step of:
    checking quality of the solder connection portion on the basis of an occupancy rate of the solder bump on the side of the land in the horizontal tomographic image of a predetermined range, wherein
    the horizontal tomographic image is formed in the predetermined range including the side of the land and a periphery of the land.

7. The X-ray inspection method according to claim 1, wherein
    the land includes a top, which faces the circuit device,
    the horizontal tomographic image of the solder connection portion includes a plurality of image parts,
    each image part represents a corresponding cross section of the solder connection portion at a corresponding distance from the top of the land toward the printed circuit board,
    the cross section is parallel to the printed circuit board, and
    the solder connection portion is inspected on the basis of the image parts of the horizontal tomographic image.

8. The X-ray inspection method according to claim 1, wherein
    the X-ray inspection device is a transmission type three-dimensional X-ray inspection device, and
    the horizontal tomographic image is formed from a three-dimensional image of the solder connection portion obtained by the transmission type three-dimensional X-ray inspection device.

9. The X-ray inspection method according to claim 1, wherein
    the warpage amount of the printed circuit board is measured in such a manner that a laser beam is irradiated to the warpage compensation marks.

10. The X-ray inspection method according to claim 9, wherein
    each warpage compensation mark is disposed near the circuit device.

11. The X-ray inspection method according to claim 9, wherein
    each warpage compensation mark is disposed on the surface of the printed circuit board opposite the circuit device.

12. The X-ray inspection method according to claim 9, wherein
    each warpage compensation mark is disposed on the surface of the printed circuit board facing the circuit device.

13. The X-ray inspection method according to claim 1, wherein the horizontal tomographic image is a cross section taken along a plane passing through the side of the land and in parallel to the surface of the printed circuit board.

14. The X-ray inspection method according to claim 1, wherein the horizontal tomographic image shows existence or nonexistence of an overflow portion of the solder bump disposed on a side of the land.

* * * * *